United States Patent
Lee et al.

(10) Patent No.: US 7,834,550 B2
(45) Date of Patent: Nov. 16, 2010

(54) ORGANIC LIGHT EMITTING DISPLAY AND FABRICATING METHOD OF THE SAME

(75) Inventors: Jong Woo Lee, Yongin-si (KR); Tae Seung Kim, Yongin-si (KR); Dae Ho Lim, Yongin-si (KR); Ho Seok Lee, Yongin-si (KR)

(73) Assignee: Samsung Mobile Display Co., Ltd. (KR)

( * ) Notice: Subject to any disclaimer, the term of this patent is extended or adjusted under 35 U.S.C. 154(b) by 423 days.

(21) Appl. No.: 11/540,024

(22) Filed: Sep. 29, 2006

(65) Prior Publication Data

US 2007/0170605 A1 Jul. 26, 2007

(30) Foreign Application Priority Data

Jan. 24, 2006 (KR) ...................... 10-2006-0007353
Mar. 21, 2006 (KR) ...................... 10-2006-0025755

(51) Int. Cl.
*H01L 51/56* (2006.01)
(52) U.S. Cl. ...................... 313/512; 445/25; 315/169.3
(58) Field of Classification Search ......... 313/498–512; 427/58, 64, 66, 532–535, 539; 438/26–29, 438/34, 82; 445/24–25; 257/40, 72, 98–100, 257/642–643, 759; 315/169.1, 169.3; 428/690–691, 428/917; 362/84, 267; 349/153
See application file for complete search history.

(56) References Cited

U.S. PATENT DOCUMENTS 3,966,449 A 6/1976 Foster
(Continued)

FOREIGN PATENT DOCUMENTS

CN 1290121 A 4/2001
(Continued)

OTHER PUBLICATIONS

Office Action issued Oct. 10, 2008 in Chinese Patent Application No. 200710001782.0.
(Continued)

*Primary Examiner*—Peter J Macchiarolo
*Assistant Examiner*—Donald L Raleigh
(74) *Attorney, Agent, or Firm*—Knobbe Martens Olson & Bear LLP

(57) ABSTRACT

Disclosed are an organic light emitting display and a fabricating method of the same, which improve impact resistance and sealing property of a device using a reinforcing member besides a sealant. A first substrate includes a pixel region and a non-pixel region, at least one organic light emitting diode is formed at the pixel region and has a first electrode, an organic layer, and a second electrode, and the non-pixel region is formed at a peripheral portion of the pixel region. A second substrate is bonded to one region of the first substrate having the pixel region. A frit is disposed between the non-pixel region of the first substrate and the second substrate for adhering the first and second substrates to each other. An adhesive being coated to be spaced along a peripheral region of the frit, and including at least two discontinuous portions. A reinforcing member is disposed between the frit and the adhesive.

26 Claims, 10 Drawing Sheets

U.S. PATENT DOCUMENTS

| | | | |
|---|---|---|---|
| 4,004,936 A | 1/1977 | Powell | |
| 4,105,292 A | 8/1978 | Conder et al. | |
| 4,238,704 A | 12/1980 | Bonk et al. | |
| 4,702,566 A | 10/1987 | Tukude | |
| 4,826,297 A | 5/1989 | Kubo et al. | |
| 4,984,059 A | 1/1991 | Kubota et al. | |
| 5,808,719 A | 9/1998 | Fujiwara et al. | |
| 5,811,927 A | 9/1998 | Anderson et al. | |
| 5,965,907 A | 10/1999 | Huang et al. | |
| 6,005,653 A | 12/1999 | Matsuzawa | |
| 6,087,717 A | 7/2000 | Ano et al. | |
| 6,195,142 B1 | 2/2001 | Gyotoku et al. | |
| 6,210,815 B1 | 4/2001 | Ooishi | |
| 6,211,938 B1 | 4/2001 | Mori | |
| 6,288,487 B1 | 9/2001 | Arai | |
| 6,424,009 B1 | 7/2002 | Ju | |
| 6,452,323 B1 | 9/2002 | Byrum et al. | |
| 6,489,719 B1 | 12/2002 | Young et al. | |
| 6,495,262 B2 | 12/2002 | Igeta | |
| 6,515,417 B1 | 2/2003 | Duggal et al. | |
| 6,551,724 B2 | 4/2003 | Ishii et al. | |
| 6,554,672 B2 | 4/2003 | Dunham et al. | |
| 6,555,025 B1 | 4/2003 | Krupetsky et al. | |
| 6,590,337 B1 | 7/2003 | Nishikawa et al. | |
| 6,603,254 B1 | 8/2003 | Ando | |
| 6,605,826 B2 | 8/2003 | Yamazaki et al. | |
| 6,624,572 B1 | 9/2003 | Kim et al. | |
| 6,646,284 B2 | 11/2003 | Yamazaki et al. | |
| 6,650,392 B2 | 11/2003 | Iwangaga et al. | |
| 6,660,547 B2 | 12/2003 | Guenther | |
| 6,671,029 B1 | 12/2003 | Choi | |
| 6,717,052 B2 | 4/2004 | Wang et al. | |
| 6,744,199 B1 | 6/2004 | Tanaka | |
| 6,791,660 B1 | 9/2004 | Hayashi et al. | |
| 6,831,725 B2 | 12/2004 | Niiya | |
| 6,833,668 B1 * | 12/2004 | Yamada et al. | 313/505 |
| 6,861,801 B2 | 3/2005 | Kim et al. | |
| 6,878,467 B2 | 4/2005 | Chung et al. | |
| 6,896,572 B2 | 5/2005 | Park et al. | |
| 6,914,661 B2 | 7/2005 | Masuda et al. | |
| 6,924,594 B2 | 8/2005 | Ogura et al. | |
| 6,936,963 B2 | 8/2005 | Langer et al. | |
| 6,956,324 B2 | 10/2005 | Yamazaki | |
| 6,956,638 B2 | 10/2005 | Akiyama et al. | |
| 6,965,195 B2 | 11/2005 | Yamazaki et al. | |
| 6,980,275 B1 | 12/2005 | Konuma et al. | |
| 6,993,537 B2 | 1/2006 | Buxton et al. | |
| 6,998,776 B2 | 2/2006 | Aitken et al. | |
| 7,030,558 B2 | 4/2006 | Park et al. | |
| 7,098,589 B2 | 8/2006 | Erchak et al. | |
| 7,112,115 B1 | 9/2006 | Yamazaki et al. | |
| 7,141,925 B2 | 11/2006 | Wittmann et al. | |
| 7,154,218 B2 | 12/2006 | Murakami et al. | |
| 7,178,927 B2 | 2/2007 | Seo | |
| 7,186,020 B2 | 3/2007 | Taya et al. | |
| 7,187,121 B2 | 3/2007 | Hasegawa et al. | |
| 7,193,218 B2 | 3/2007 | Nagano | |
| 7,193,364 B2 | 3/2007 | Klausmann et al. | |
| 7,193,366 B2 | 3/2007 | Tomimatsu et al. | |
| 7,202,602 B2 | 4/2007 | Anandan | |
| 7,211,938 B2 | 5/2007 | Tanaka | |
| 7,214,429 B2 | 5/2007 | Kato et al. | |
| 7,247,986 B2 | 7/2007 | Kang et al. | |
| 7,255,823 B1 | 8/2007 | Guether et al. | |
| 7,291,977 B2 | 11/2007 | Kim et al. | |
| 7,306,346 B2 * | 12/2007 | Fukuoka et al. | 362/84 |
| 7,317,281 B2 * | 1/2008 | Hayashi et al. | 313/512 |
| 7,332,858 B2 * | 2/2008 | Nomura et al. | 313/504 |
| 7,342,357 B2 * | 3/2008 | Sakano et al. | 313/512 |
| 7,344,901 B2 | 3/2008 | Hawtof et al. | |
| 7,359,021 B2 | 4/2008 | Ota et al. | |
| 7,371,143 B2 | 5/2008 | Becken et al. | |
| 7,393,257 B2 | 7/2008 | Spencer et al. | |
| 7,407,423 B2 | 8/2008 | Aitken et al. | |
| 7,423,375 B2 | 9/2008 | Guenther et al. | |
| 7,425,166 B2 | 9/2008 | Burt et al. | |
| 7,425,518 B2 | 9/2008 | Yoshida et al. | |
| 7,426,010 B2 | 9/2008 | Lee et al. | |
| 7,452,738 B2 | 11/2008 | Hayashi et al. | |
| 7,474,375 B2 | 1/2009 | Kwak et al. | |
| 7,498,186 B2 | 3/2009 | Lee | |
| 7,528,544 B2 | 5/2009 | Kwak et al. | |
| 7,537,504 B2 | 5/2009 | Becken et al. | |
| 7,514,280 B2 | 7/2009 | Lee | |
| 7,564,185 B2 | 7/2009 | Song et al. | |
| 7,579,203 B2 | 8/2009 | Yamazaki et al. | |
| 7,579,220 B2 | 8/2009 | Ohnuma et al. | |
| 7,585,022 B2 | 9/2009 | Achilles et al. | |
| 7,586,254 B2 | 9/2009 | Kwak et al. | |
| 7,597,603 B2 | 10/2009 | Becken et al. | |
| 2002/0024051 A1 | 2/2002 | Yamazaki et al. | |
| 2002/0044253 A1 | 4/2002 | Masuda et al. | |
| 2002/0084464 A1 | 7/2002 | Yamazaki et al. | |
| 2002/0125816 A1 | 9/2002 | Dunham et al. | |
| 2002/0125817 A1 | 9/2002 | Yamazaki et al. | |
| 2003/0020124 A1 | 1/2003 | Guenther | |
| 2003/0066311 A1 | 4/2003 | Li et al. | |
| 2003/0077396 A1 | 4/2003 | LeCompte et al. | |
| 2003/0122476 A1 | 7/2003 | Wang et al. | |
| 2003/0137630 A1 * | 7/2003 | Niiya | 349/153 |
| 2003/0218422 A1 | 11/2003 | Park et al. | |
| 2003/0222061 A1 | 12/2003 | Langer et al. | |
| 2004/0069017 A1 | 4/2004 | Li et al. | |
| 2004/0075380 A1 | 4/2004 | Takemoto et al. | |
| 2004/0104655 A1 | 6/2004 | Kodera et al. | |
| 2004/0141141 A1 | 7/2004 | Ota et al. | |
| 2004/0150319 A1 | 8/2004 | Tomimatsu et al. | |
| 2004/0169033 A1 | 9/2004 | Kuibira et al. | |
| 2004/0169174 A1 | 9/2004 | Huh et al. | |
| 2004/0206953 A1 | 10/2004 | Morena et al. | |
| 2004/0207314 A1 | 10/2004 | Aitken et al. | |
| 2004/0217703 A1 | 11/2004 | Wittmann et al. | |
| 2004/0251827 A1 | 12/2004 | Kang et al. | |
| 2004/0256979 A1 | 12/2004 | Murakami et al. | |
| 2005/0001545 A1 | 1/2005 | Aitken et al. | |
| 2005/0023956 A1 | 2/2005 | Kwak et al. | |
| 2005/0088595 A1 | 4/2005 | Akiyama et al. | |
| 2005/0092927 A1 | 5/2005 | Nagano | |
| 2005/0110404 A1 | 5/2005 | Park et al. | |
| 2005/0127820 A1 | 6/2005 | Yamazaki et al. | |
| 2005/0174046 A1 | 8/2005 | Hasegawa et al. | |
| 2005/0195355 A1 | 9/2005 | Kwak et al. | |
| 2005/0200798 A1 | 9/2005 | Tanaka | |
| 2005/0231107 A1 | 10/2005 | Yamazaki et al. | |
| 2005/0233885 A1 | 10/2005 | Yoshida et al. | |
| 2005/0248270 A1 * | 11/2005 | Ghosh et al. | 313/512 |
| 2005/0258744 A1 | 11/2005 | Kwak et al. | |
| 2005/0275342 A1 | 12/2005 | Yanagawa | |
| 2006/0082298 A1 | 4/2006 | Becken et al. | |
| 2006/0084348 A1 * | 4/2006 | Becken et al. | 445/25 |
| 2006/0088951 A1 | 4/2006 | Hayashi et al. | |
| 2006/0261336 A1 | 11/2006 | Ohnuma et al. | |
| 2006/0284556 A1 | 12/2006 | Tremel et al. | |
| 2006/0290261 A1 | 12/2006 | Sawai et al. | |
| 2007/0120478 A1 | 5/2007 | Lee et al. | |
| 2007/0128966 A1 | 6/2007 | Becken et al. | |
| 2007/0170324 A1 | 7/2007 | Lee et al. | |
| 2007/0170423 A1 | 7/2007 | Choi et al. | |
| 2007/0170605 A1 | 7/2007 | Lee et al. | |
| 2007/0170839 A1 | 7/2007 | Choi et al. | |
| 2007/0170845 A1 | 7/2007 | Choi et al. | |
| 2007/0170850 A1 | 7/2007 | Choi et al. | |
| 2007/0170855 A1 | 7/2007 | Choi et al. | |
| 2007/0170857 A1 | 7/2007 | Choi et al. | |

| | | |
|---|---|---|
| 2007/0170859 A1 | 7/2007 | Choi et al. |
| 2007/0170860 A1 | 7/2007 | Choi et al. |
| 2007/0170861 A1 | 7/2007 | Lee et al. |
| 2007/0171637 A1 | 7/2007 | Choi |
| 2007/0172971 A1 | 7/2007 | Boroson |
| 2007/0173167 A1 | 7/2007 | Choi et al. |
| 2007/0176549 A1 | 8/2007 | Park |
| 2007/0177069 A1 | 8/2007 | Lee |
| 2007/0194690 A1 | 8/2007 | Lee |
| 2007/0194710 A1 | 8/2007 | Song et al. |
| 2007/0196949 A1 | 8/2007 | Lee |
| 2007/0197120 A1 | 8/2007 | Lee |
| 2007/0232182 A1 | 10/2007 | Park |
| 2008/0074036 A1 | 3/2008 | Wang et al. |

FOREIGN PATENT DOCUMENTS

| | | |
|---|---|---|
| CN | 1438825 | 8/2003 |
| CN | 1551686 A | 12/2004 |
| CN | 1577413 | 2/2005 |
| CN | 1617636 | 5/2005 |
| CN | 1212662 | 7/2005 |
| CN | 1670570 | 9/2005 |
| JP | 030-37933 | 2/1991 |
| JP | 04-147217 | 5/1992 |
| JP | 04-301879 | 10/1992 |
| JP | 06-034983 | 2/1994 |
| JP | 06-337429 | 10/1994 |
| JP | 07 074583 | 3/1995 |
| JP | 09-278483 | 10/1997 |
| JP | 10-074583 | 3/1998 |
| JP | 10-161137 | 6/1998 |
| JP | 63-163423 | 7/1998 |
| JP | 10-201585 | 8/1998 |
| JP | 11-007031 | 1/1999 |
| JP | 11-202349 | 7/1999 |
| JP | 2001-022293 | 1/2001 |
| JP | 2001-052858 | 2/2001 |
| JP | 2001-055527 | 2/2001 |
| JP | 2001-203076 | 2/2001 |
| JP | 2001-110564 | 4/2001 |
| JP | 2001-230072 | 8/2001 |
| JP | 2001-319775 | 11/2001 |
| JP | 2002 020169 | 1/2002 |
| JP | 2002-093576 | 3/2002 |
| JP | 2002-100472 | 4/2002 |
| JP | 2002 117777 | 4/2002 |
| JP | 2002 170664 | 6/2002 |
| JP | 2002-216951 | 8/2002 |
| JP | 2002-280169 | 9/2002 |
| JP | 2002-318547 | 10/2002 |
| JP | 2002-324662 | 11/2002 |
| JP | 2002-359070 | 12/2002 |
| JP | 2003-123966 | 4/2003 |
| JP | 2003-228302 | 8/2003 |
| JP | 2003 243160 | 8/2003 |
| JP | 2003-297552 | 10/2003 |
| JP | 2003-332061 | 11/2003 |
| JP | 2004 29552 | 1/2004 |
| JP | 2004-070351 | 3/2004 |
| JP | 04-151656 | 5/2004 |
| JP | 2004 303733 | 10/2004 |
| JP | 2004 319103 | 11/2004 |
| JP | 2005-049808 | 2/2005 |
| JP | 2005-071984 | 3/2005 |
| JP | 2005-112676 | 4/2005 |
| JP | 2005-510831 | 4/2005 |
| JP | 2005-123089 | 5/2005 |
| JP | 2005-158672 | 6/2005 |
| JP | 2005 190683 | 7/2005 |
| JP | 2005-251415 | 9/2005 |
| JP | 2005-258405 | 9/2005 |
| JP | 2006 340020 | 12/2005 |
| JP | 2006-524419 | 10/2006 |
| KR | 10-1995-0009817 | 4/1995 |
| KR | 10-2000-0045292 | 7/2000 |
| KR | 10-2001-0084380 | 9/2001 |
| KR | 10-2002-0051153 | 6/2002 |
| KR | 10-2003-0044656 | 6/2003 |
| KR | 10-2004-0011138 | 2/2004 |
| KR | 10-2005-0070543 | 7/2005 |
| KR | 10-2005-0112318 | 11/2005 |
| KR | 10-2005-0115408 | 12/2005 |
| KR | 10-2006-0005369 | 1/2006 |
| KR | 10-2006-0011831 | 2/2006 |
| KR | 10-2006-0027321 | 3/2006 |
| TW | 569166 | 1/2004 |
| TW | I227094 | 1/2005 |
| TW | I228686 | 3/2005 |
| TW | I237218 | 8/2005 |
| TW | 200541379 | 12/2005 |
| TW | 200541382 | 12/2005 |
| WO | WO 02/21557 | 3/2002 |
| WO | WO 03/005774 | 1/2003 |
| WO | WO 2004/094331 | 11/2004 |
| WO | WO 2004/095597 | 11/2004 |
| WO | WO 2004/112160 | 12/2004 |
| WO | WO 2005/050751 | 6/2005 |

OTHER PUBLICATIONS

Chinese Office Action and English translation in corresponding Patent Application No. 200710000143.2 dated Sep. 26, 2008.
Chinese Office Action issued Aug. 1, 2008 Patent Application No. 200710001301.6 with English translation.
Chinese Office Action issued Oct. 10, 2008 in Corresponding Patent Application No. 200710003941.0 with its English translation—11 pages.
Chinese Office Action issued on Aug. 1, 2008 in corresponding Patent Application No. 2007100015717 (w/English translation) in 19 pages.
Chinese Office Action Issued on Dec. 19, 2008 in Corresponding Patent Application No. 2007100072531 with its English translation—13 pages.
Chinese Rejection Decision issued on May 8, 2009 in the corresponding Patent Application No. 200710004080.8.
European Search Report from the corresponding European Patent Application No. 07101294.2 dated Jun. 6, 2007.
European Search Report from the corresponding European Patent Application No. 07101295.9 dated May 24, 2007.
U.S. Office Action dated Feb. 2, 2009 in U.S. Appl. No. 11/529,916.
U.S. Office Action dated Apr. 3, 2009 in U.S. Appl. No. 11/529,891.
U.S. Office Action dated Apr. 3, 2009 in U.S. Appl. No. 11/541,055.
U.S. Office Action dated Aug. 19, 2009 in U.S. Appl. No. 11/529,914.
U.S. Office Action dated Dec. 31, 2009 in U.S. Appl. No. 11/541,139.
U.S. Office Action dated Nov. 5, 2009 in U.S. Appl. No. 11/541,047.
U.S. Office Action dated Nov. 28, 2007 in U.S. Appl. No. 11/540,150.
U.S. Office Action dated Aug. 21, 2008 in U.S. Appl. No. 11/540,150.
U.S. Office Action dated Nov. 15, 2007 in U.S. Appl. No. 11/541,009.
U.S. Office Action dated Jun. 19, 2008 in U.S. Appl. No. 11/541,009.
U.S. Office Action dated Dec. 3, 2008 in U.S. Appl. No. 11/541,009.
U.S. Office Action dated Apr. 30, 2009 in U.S. Appl. No. 11/540,151.
U.S. Office Action dated Feb. 11, 2009 in U.S. Appl. No. 11/529,883.
U.S. Office Action dated Jul. 17, 2009 in U.S. Appl. No. 11/529,883.
U.S. Office Action dated Dec. 30, 2009 in U.S. Appl. No. 11/541,048.
U.S. Office Action dated Dec. 8, 2008 in U.S. Appl. No. 11/540,021.
U.S. Office Action dated Apr. 27, 2009 in U.S. Appl. No. 11/540,021.
U.S. Office Action dated May 4, 2009 in U.S. Appl. No. 11/529,995.
U.S. Office Action dated May 8, 2009 in U.S. Appl. No. 11/540,149.
U.S. Appl. No. 11/540,150, filed Sep. 29, 2006, and its ongoing prosecution history, including without limitation Office Actions, Amendments, Remarks, and any other potentially relevant documents.
Chinese Office Action issued on Jan. 8, 2010 in Patent Application No. 200710003941.0.

Korean Office Action from Patent Application No. 10-2006-0006148 dated Sep. 26, 2006.
Korean Office Action from Patent Application No. 10-2006-0007890, dated Sep. 26, 2006.
Korean Office Action from Patent Application No. 10-2006-0007963, dated Sep. 26, 2006.
Taiwanese Office Action issued Jan. 18, 2010 from Application No. 95145107.
Taiwanese Office Action Issued Apr. 2, 2010 from Application No. 95144932.
U.S. Office Action dated Mar. 29, 2010 in U.S. Appl. No. 11/541,055.
U.S. Office Action (Advisory Action) dated May 19, 2010 in U.S. Appl. No. 11/529,914.
U.S. Office Action dated May 25, 2010 in U.S. Appl. No. 11/529,995.

* cited by examiner

ORGANIC LIGHT EMITTING DISPLAY AND FABRICATING METHOD OF THE SAME

CROSS-REFERENCE TO RELATED APPLICATIONS

This application claims the benefit of Korean Patent Application Nos. 10-2006-0025755, filed on Mar. 21, 2006, and 10-2006-0007353, filed on Jan. 24, 2006, in the Korean Intellectual Property Office, the disclosure of which is incorporated herein by reference.

This application is related to and incorporates herein by reference the entire contents of the following concurrently filed applications:

BACKGROUND OF THE INVENTION

1. Field of the Invention

The present invention relates to an organic light emitting display and a fabricating method of the same, and more particular to packaging of an organic light emitting display.

2. Description of the Related Technology

In recent years, an organic light emitting display using organic light emitting diode has drawn attention. An organic light emitting display is an emissive display, which electrically excites an organic compound having fluorescent characteristic to emit light. The organic light emitting display can be driven at a low voltage, and has excellent light-emission, a wide angle of visibility, and a high-speed response.

| Title | Atty. Docket No. | Filing Date | Application No. |
|---|---|---|---|
| ORGANIC LIGHT-EMITTING DISPLAY DEVICE AND METHOD OF FABRICATING THE SAME | SDISHN.043AUS | | |
| ORGANIC LIGHT-EMITTING DISPLAY DEVICE AND METHOD OF MANUFACTURING THE SAME | SDISHN.045AUS | | |
| ORGANIC LIGHT EMITTING DISPLAY DEVICE | SDISHN.048AUS | | |
| ORGANIC LIGHT-EMITTING DISPLAY DEVICE WITH FRIT SEAL AND REINFORCING STRUCTURE | SDISHN.051AUS | | |
| ORGANIC LIGHT EMITTING DISPLAY DEVICE METHOD OF FABRICATING THE SAME | SDISHN.052AUS | | |
| ORGANIC LIGHT EMITTING DISPLAY AND METHOD OF FABRICATING THE SAME | SDISHN.053AUS | | |
| ORGANIC LIGHT-EMITTING DISPLAY DEVICE WITH FRIT SEAL AND REINFORCING STRUCTURE BONDED TO FRAME | SDISHN.054AUS | | |
| METHOD FOR PACKAGING ORGANIC LIGHT EMITTING DISPLAY WITH FRIT SEAL AND REINFORCING STURUTURE | SDISHN.055AUS | | |
| METHOD FOR PACKAGING ORGANIC LIGHT EMITTING DISPLAY WITH FRIT SEAL AND REINFORCING STURUTURE | SDISHN.056AUS | | |
| ORGANIC LIGHT-EMITTING DISPLAY DEVICE AND THE PREPARATION METHOD OF THE SAME | SDISHN.060AUS | | |
| ORGANIC LIGHT EMITTING DISPLAY AND FABRICATING METHOD OF THE SAME | SDISHN.061AUS | | |
| ORGANIC LIGHT-EMITTING DISPLAY AND METHOD OF MAKING THE SAME | SDISHN.062AUS | | |
| ORGANIC LIGHT EMITTING DISPLAY DEVICE AND MANUFACTURING METHOD THEREOF | SDISHN.064AUS | | |
| ORGANIC LIGHT-EMITTING DISPLAY DEVICE AND MANUFACTURING METHOD OF THE SAME | SDISHN.066AUS | | |
| ORGANIC LIGHT EMITTING DISPLAY AND FABRICATING METHOD OF THE SAME | SDISHN.067AUS | | |
| ORGANIC LIGHT EMITTING DISPLAY AND METHOD OF FABRICATING THE SAME | SDISW.017AUS | | |
| ORGANIC LIGHT EMITTING DISPLAY DEVICE METHOD OF FABRICATING THE SAME | SDISW.018AUS | | |
| ORGANIC LIGHT EMITTING DISPLAY AND METHOD OF FABRICATING THE SAME | SDISW.020AUS | | |

An organic light emitting display includes a plurality of pixels formed on a substrate. Each of the pixels includes an organic light emitting diode and a thin film transistor (TFT) for driving the organic light emitting diode. Since such an organic light emitting diode is susceptible to oxygen and moisture, a sealing structure has been proposed to prevent oxygen and moisture from entering the pixels. The sealing structure covers a deposition substrate with a metal cap having an absorbent or a sealing glass substrate.

U.S. Pat. No. 6,998,776 discloses a structure for sealing an organic light emitting diode by coating a glass substrate with a frit. In U.S. Pat. No. 6,998,776, the frit may seal a gap between a substrate and a sealing substrate, and allows the organic light emitting diode to be efficiently protected.

However, in a structure for sealing an organic light emitting diode using a sealing substrate coated with a frit, during a process of irradiating a laser to the frit, a stress occurs at the substrate due to heat of the laser. This causes a scribing line to be obscure during a process of scribing a mother substrate into unit substrates, which may cause cracks. Accordingly, an occurrence rate of a defective device increases and the impact resistance is deteriorated when conducting reliance tests. The discussion in this section is to provide background information of the related technology, and does not constitute an admission of prior art.

SUMMARY OF CERTAIN INVENTIVE ASPECTS

One aspect of the invention provides an organic light emitting display (OLED) device. The device comprises: a first substrate; a second substrate placed over the first substrate, wherein each of the first and second substrates is made of a single layer or comprises a plurality of layers; an array of organic light-emitting pixels interposed between the first and second substrates; and a sealing structure interposed between the first and second substrates while surrounding the array, wherein the sealing structure, the first substrate and the second substrate in combination define an enclosed space in which the array is located; wherein the sealing structure comprises a first member, a second member and a third member, the first member comprising a first material, the second member comprising a second material, and the third member comprising a third material, and wherein the second member is located between and contacts the first and second members.

The first member may form a closed loop surrounding the array. The second member may form a closed loop surrounding the first member. The third member may substantially surround the second member while having at least one discontinuous portion. The third member may comprise at least two discontinuous portions. The at least one discontinuous portion may comprise a gap or a material other than the third material. The first material may comprise frit. The second material may be the same as the third material. There may be an identifiable interface between the second and third members. The second material may be different from the third material. The second material may comprise one or more selected from the group consisting of epoxy, acryl, and urethane resin. The third material may comprise one or more selected from the group consisting of epoxy, acrylate, urethane acrylate, and acrylate cyanide resin.

Another aspect of the invention provides a method of making an organic light emitting display (OLED) device. The method comprises: providing a device comprising: a first substrate; a second substrate placed over the first substrate; an array of organic light-emitting pixels interposed between the first and second substrates; and a first sealing member interposed between the first and second substrates while substantially surrounding the array, a third sealing member interposed between the first and second substrates while substantially surrounding the first sealing member with a space defined between the first and third sealing members and further between the first and second substrates. The method may further comprise filling a material into the space so as to form a second sealing member interposed between the first and second substrates and further between the first and second sealing member.

The third sealing member may comprise at least one discontinuous portion while substantially surrounding the first sealing member. Filling may comprise injecting the material into the space via the at least one discontinuous portion. Filling may further comprise moving the material within the space. Moving the material within the space may use positive or negative air pressure. The third sealing member may comprise a portion generally parallel to a portion of the first sealing member. The method may further comprise curing the material after filling into the space. The first sealing member may comprise frit and form a closed loop surrounding the array. The second sealing member and third sealing member may comprise substantially the same material. The third material may have a viscosity between about 100 cp and about 4,000 cp.

Providing the device may comprise: providing the second substrate, the first sealing member formed on the substrate and the third sealing member formed on the second substrate; and arranging the first and second substrates such that the array is interposed between the first and second substrates and that the array is surrounded by the first sealing member. Providing the device may comprise: providing the first substrate and the first sealing member formed on the first substrate; and forming the third sealing member substantially parallel to the first sealing member with a gap therebetween; and arranging the first and second substrates such that the array is interposed between the first and second substrates and that the array is surrounded by the first sealing member.

Providing the device may further comprise melting and re-solidifying at least part of the first sealing member after arranging so as to bond the first sealing member to the first and second substrates. Forming the third sealing material may comprise utilizing a screen printing or dispensing method.

The device may further comprise: a plurality of additional arrays of organic light-emitting pixels interposed between the first and second substrates; a plurality of additional first sealing members interposed between the first and second substrates, a first one of the additional first sealing members surrounding one of the additional arrays; a plurality of additional third sealing members interposed between the first and second substrates, one of the additional third sealing members substantially surrounds the first one of the additional first sealing members with an additional space, which is defined between the first one of the additional first sealing members and the one of the additional third sealing members, and wherein the additional space is further between the first and second substrates; and wherein the method may further comprise filling the material into the additional space so as to form an additional second sealing member interposed between the first one of the additional first sealing members and the one of the additional third sealing members. The method may further comprise cutting the resulting product into a plurality of pieces, comprising a cut-portion of the first substrate, a cut-portion of the second substrate, the array of organic light-emitting pixels, the first sealing member, the second sealing member and the third sealing member.

Another aspect of the invention provides an organic light emitting display and a fabricating method of the same, which improve impact resistance and sealing property of a device using a reinforcing member besides a sealant.

Another aspect of the invention provides an organic light emitting display, comprising: a first substrate including a pixel region and a non-pixel region, at least one organic light emitting diode being formed at the pixel region and having a first electrode, an organic layer, and a second electrode, and the non-pixel region being formed at a peripheral portion of the pixel region; a second substrate bonded to one region of the first substrate having the pixel region; a frit disposed between the non-pixel region of the first substrate and the second substrate for adhering the first and second substrates to each other; an adhesive being coated to be spaced along a peripheral region of the frit, and including at least two discontinuous portions; and a reinforcing member disposed between the frit and the adhesive.

Yet another aspect of the invention provides a method for fabricating an organic light emitting display including a first substrate and a second substrate, the first substrate including a pixel region and a non-pixel region, at least one organic light emitting diode being formed at the pixel region, the non-pixel region being formed at a peripheral portion of the pixel region, and the second substrate being bonded to one region having the pixel region of the first substrate, the method comprising the steps of: (i) coating a frit on one region of the second substrate and heating the frit; (ii) coating an adhesive along a peripheral region of the frit; (iii) bonding the first substrate and the second substrate to each other; (iv) curing the adhesive; (v) irradiating a laser or infrared ray to the frit; (vi) forming at least two discontinuous portions passing through one region of the adhesive; and (vii) injecting a reinforcing member between the frit and the adhesive through the discontinuous portion.

Another aspect of the invention provides a method for fabricating an organic light emitting display including a first mother substrate and a second mother substrate, the first mother substrate including at least one pixel region and a non-pixel region, an organic light emitting diode being formed at the at least one pixel region, the non-pixel region being formed at a perimeter of the pixel region, and the second substrate being bonded to the first mother substrate, the method comprising the steps of: (i) coating a frit on a peripheral portion of the pixel region of the second mother substrate and heating the frit; (ii) coating an adhesive to be spaced from a peripheral region of the frit; (iii) bonding the first mother substrate and the second mother substrate to each other; (iv) curing the adhesive; (v) irradiating a laser or infrared ray to the frit (vi) scribing the bonded first and second mother substrates into a plurality of display panels; (vii) injecting a reinforcing member between the frit and the adhesive; and (viii) curing the reinforcing member.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF CERTAIN INVENTIVE EMBODIMENTS

Figure 1:
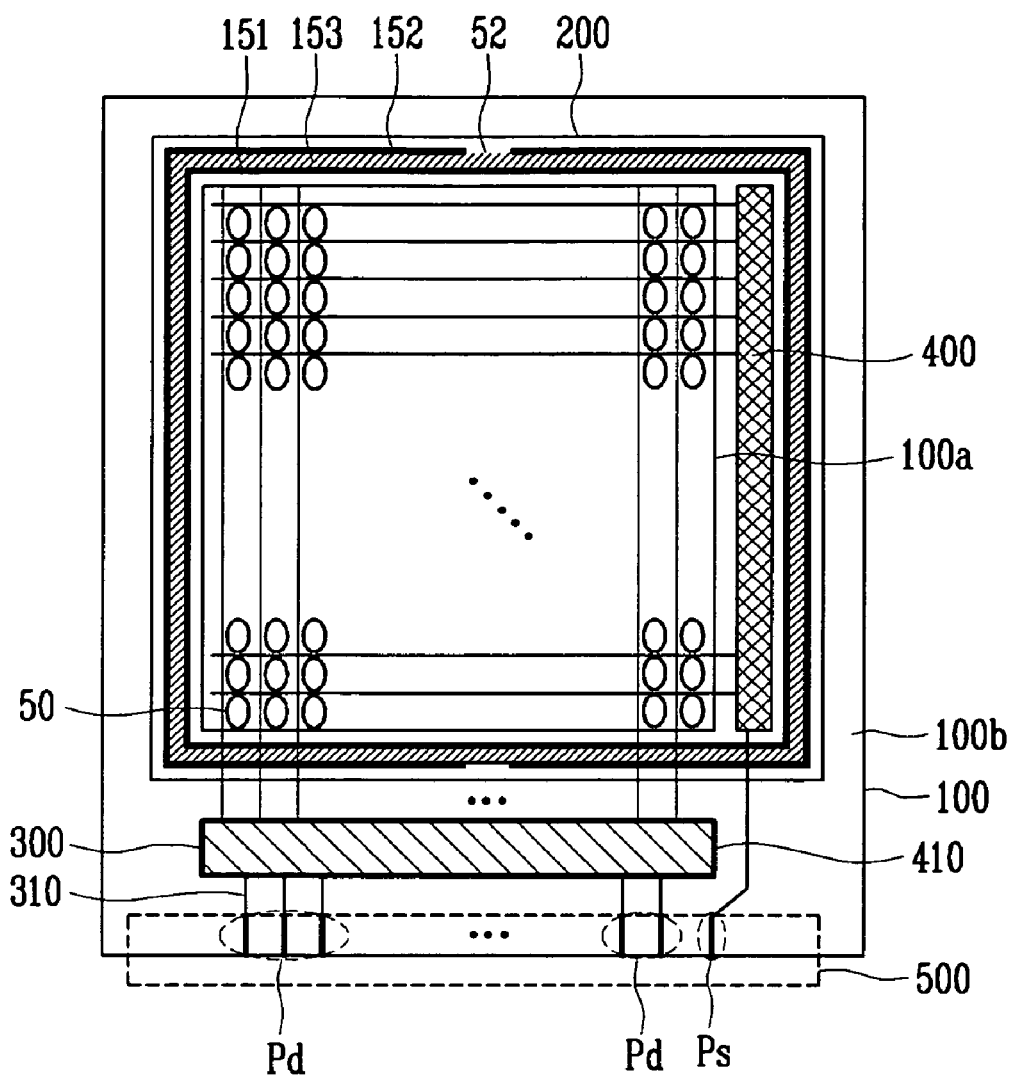
FIG. 1 is a schematic top plan view showing an example of an organic light emitting display according to an embodiment.

Hereinafter, embodiments according to the invention will be described with reference to the accompanying drawings. Here, when one element is connected to another element, one element may be either directly connected to another element or indirectly connected to another element via another element. Further, irrelevant elements are omitted for clarity. Also, like reference numerals refer to identical or functionally similar elements.

An organic light emitting display (OLED) is a display device comprising an array of organic light emitting diodes. Organic light emitting diodes are solid state devices which include an organic material and are adapted to generate and emit light when appropriate electrical potentials are applied.

Figure 6A:
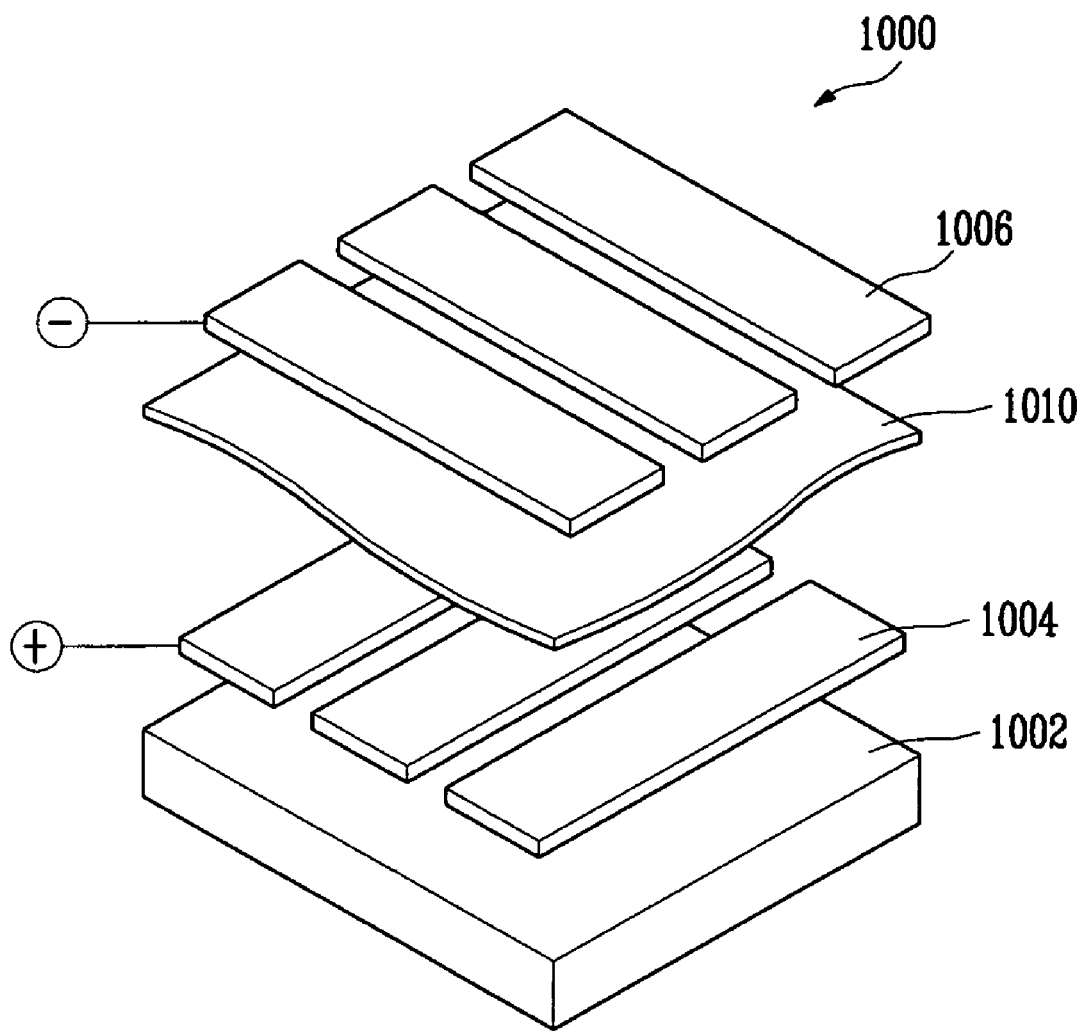
FIG. 6A is a schematic exploded view of a passive matrix type organic light emitting display device in accordance with one embodiment.
Figure 6B:
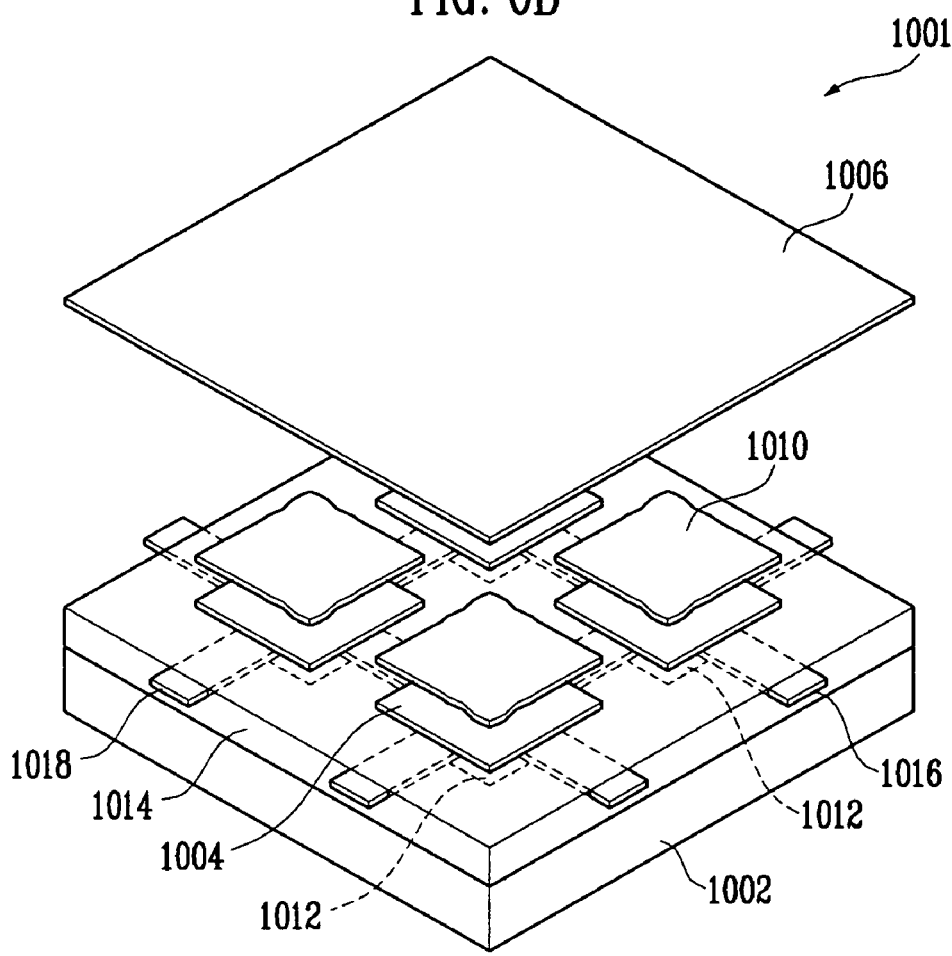
FIG. 6B is a schematic exploded view of an active matrix type organic light emitting display device in accordance with one embodiment.

OLEDs can be generally grouped into two basic types dependent on the arrangement with which the stimulating electrical current is provided. FIG. 6A schematically illustrates an exploded view of a simplified structure of a passive matrix type OLED 1000. FIG. 6B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 6A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 6B, the active matrix OLED (AMOLED) includes driving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is opposingly arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 6C:
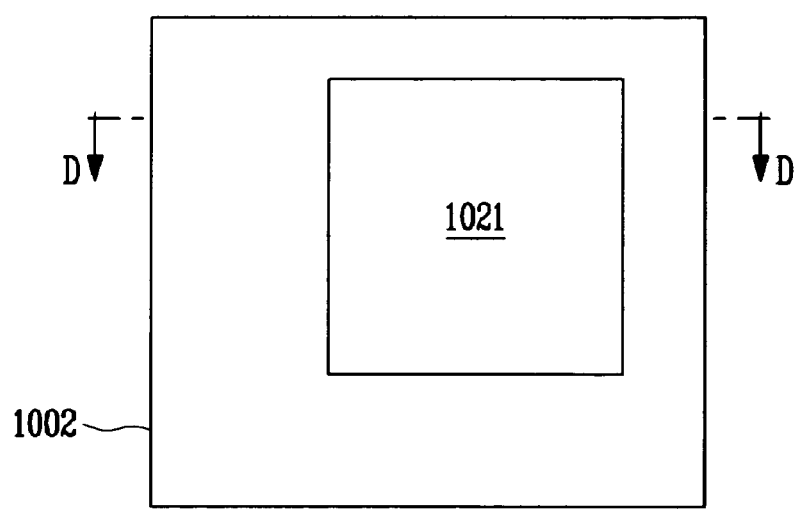
FIG. 6C is a schematic top plan view of an organic light emitting display in accordance with one embodiment.

In many embodiments, an OLED pixel array 1021 comprising a plurality of organic light emitting pixels is arranged over a substrate 1002 as shown in FIG. 6C. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 6D:
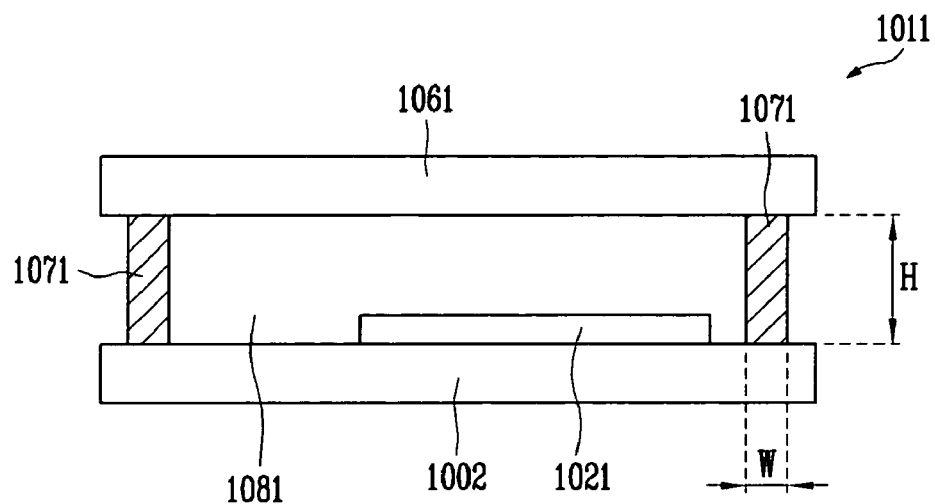
FIG. 6D is a cross-sectional view of the organic light emitting display of FIG. 6C, taken along the line d-d.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 6D schematically illustrates a cross-section of an encapsulated OLED device 1011 having a layout of FIG. 6C and taken along the line d-d of FIG. 6C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 6D. The width varies among embodiments and ranges from about 300 μm to about 3000 μm, optionally from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 6D. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or glass frit," which includes fine glass particles. The frit particles includes one or more of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include $ZnSiO_4$, $PbTiO_3$, $ZrO_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxyl propyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 6E:
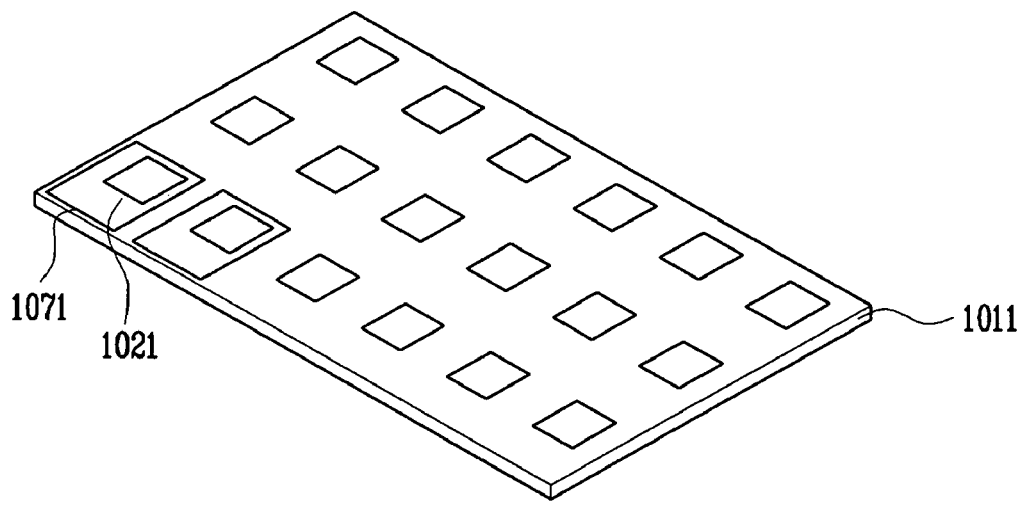
FIG. 6E is a schematic perspective view illustrating mass production of organic light emitting devices in accordance with one embodiment.

In some embodiments, OLED devices 1011 are mass produced. In an embodiment illustrated in FIG. 6E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 6D. In certain embodiments, the individual OLED devices 1011 then further undergo additional packaging operations to further improve the sealing formed by the frit seal 1071 and the top and bottom substrates 1061, 1002.

Figure 2:
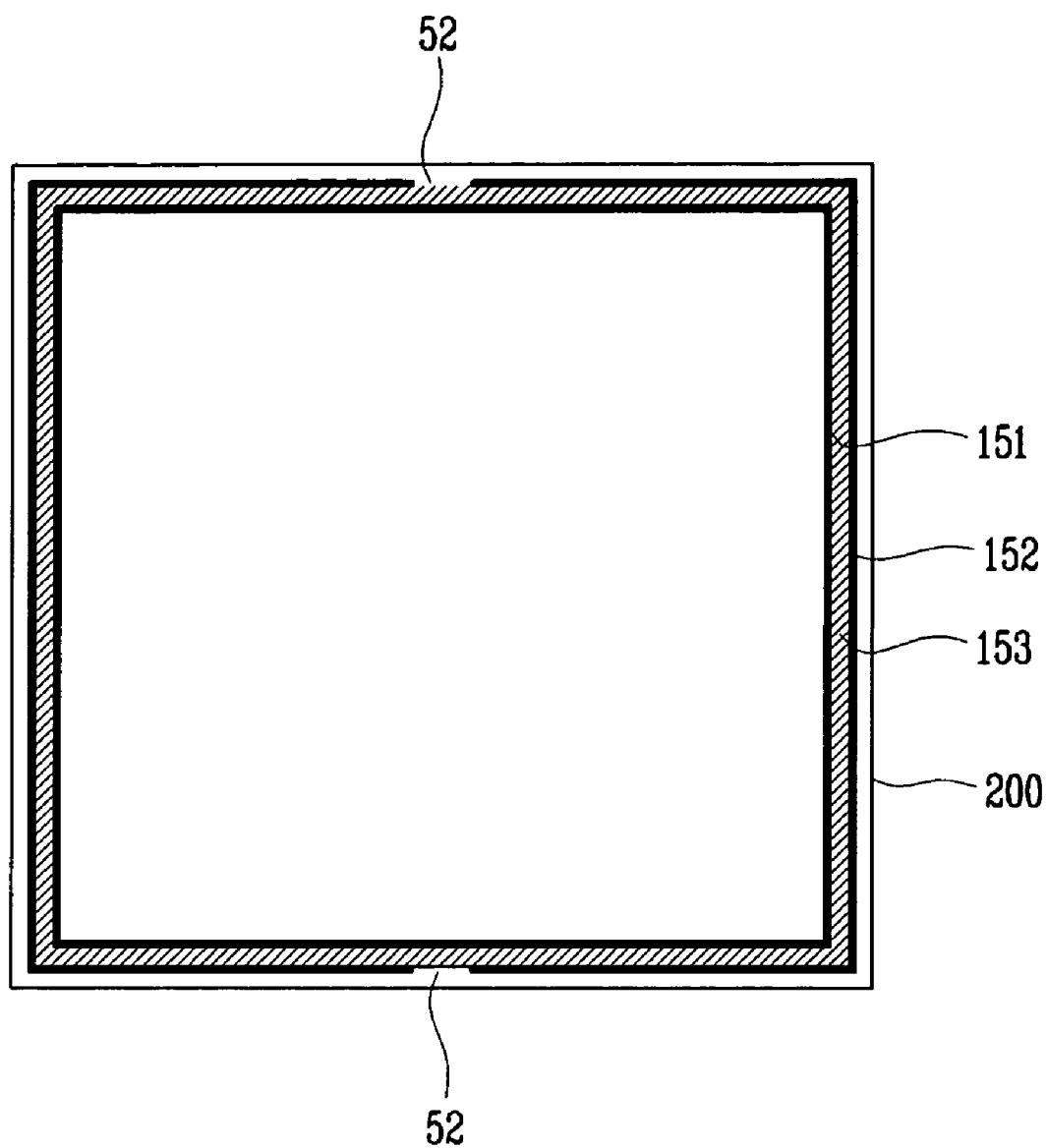
FIG. 2 is a schematic top plan view showing an example of a sealing substrate in the organic light emitting display shown in FIG. 1.
Figure 3:
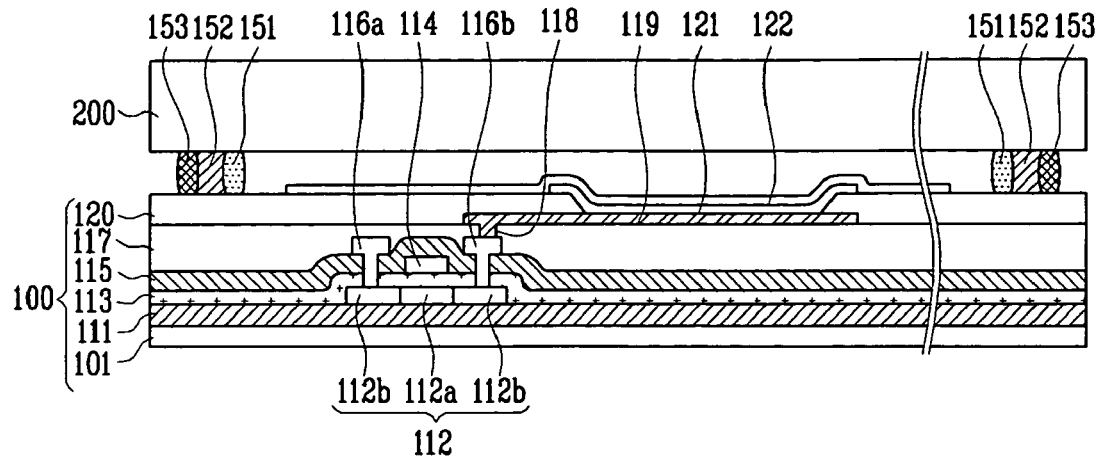
FIG. 3 is a schematic cross-sectional view of the organic light emitting display shown in FIG. 2.

FIG. 1 is a plan view showing an example of an organic light emitting display according to an embodiment. FIG. 2 is a plan view showing an example of a sealing substrate in the organic light emitting display shown in FIG. 1.

With reference to FIG. 1 and FIG. 2, the organic light emitting display according to an embodiment includes a first substrate 100, a frit 151, an adhesive 152, a reinforcing member 153, and a second substrate 200.

The first substrate 100 includes a pixel region 100a and a non-pixel region 100b. The pixel region 100a includes a plurality of scan lines S1, S2, S3, . . . , Sn, a plurality of data lines D1, D2, D3, . . . , Dm, and a plurality of pixels 50. The plurality of pixels 50 are arranged at regions defined by the scan lines S1, S2, S3, . . . , Sn and the data lines D1, D2, D3, . . . , Dm. Each of the pixels 50 is coupled with one of the scan lines S1, S2, S3, . . . , Sn, one of the data lines D1, D2, D3, . . . , Dm, and a power supply line (not shown). Each pixel 50 emits one of red, green, blue, and white colors at a predetermined luminance level. Consequently, the pixel region 100a displays an image according to the colors and the luminances of the pixels 50. The non-pixel region 100b is formed to surround the pixel region 100a. The non-pixel region 100b may refer to all the regions outside the pixel region 100a on the first substrate 100. The non-pixel region 100b may include a data driver 300, a scan driver 400, and a pad portion 500.

The data driver 300 supplies a data signal to the plurality of data lines D1, D2, and D3 extending in the pixel region 100a of the first substrate 100. The data driver 300 may be formed at one side of the pixel region 100a in the first substrate 100 and at another side adjacent to one side of the pixel region on which the scan driver 400 is formed. Here, the data driver 300 may be mounted on the first substrate 100 in a chip-on-glass (COG) type chip pattern. Further, the data driver 300 may be coupled with a plurality of first pads Pd in the pad portion 500 through a plurality of data supply lines 310.

The scan driver 400 sequentially supplies a scan signal to the plurality of scan lines S1, S2, S3, . . . , and Sn extending in the pixel region 100a. The scan driver 400 is formed at one side of the pixel region 100a in the first substrate 100. The scan driver 400 is coupled with at least one first pad Ps in the pad portion 500 through at least one scan supply line 410.

The pad portion 500 is formed at the first substrate 100 adjacent to the first scan driver 400 and the data driver 500. The pad portion 500 is electrically coupled to the scan supply line 410 and the data supply line 310, and supplies an electric signal to the plurality of scan lines S1, S2, S3, . . . , Sn and the plurality of data lines D1, D2, D3, . . . , Dm of the pixel region 100a.

The frit 151 is disposed between a non-pixel region 100b of the first substrate 100 and the second substrate 200, and adheres the first substrate 100 and the second substrate 200 to each other. In the illustrated built-in type scan driver 400, the pixel region 100a and the scan driver 400 are sealed with the frit 151. In other embodiments, the scan driver 400 may be outside the frit. The frit may only enclose the pixel region 100a. Since the frit 150 seals a gap between the first substrate 100 and the second substrate 200, an organic light emitting diode interposed between the first substrate 100 and the second substrate 200 can be protected from water or oxygen. The frit 151 may include a filler (not shown) and an absorbent (not shown). The filler may adjust a thermal expansion coefficient. The absorbent absorbs a laser or an infrared ray. Further, the frit 151 may be cured by a laser or ultra-violet ray irradiation. Here, an intensity of the laser irradiated to the frit ranges about 25 to about 60 W.

When a temperature of a glass material is rapidly dropped, a frit in a glass powder form is produced. The frit may include a glass powder and an oxide powder. Further, when organic materials are added to the frit, a frit paste in a gel state is formed. The paste in the gel state is applied along a sealing line of the second substrate. Thereafter, when the frit is sintered at a predetermined temperature, the organic materials are removed, leaving a cured frit in a solid state. In one embodiment, the sintering temperature may range from about 300° C. to about 700° C.

The adhesive 152 is formed to be spaced from the frit 151, and includes at least two discontinuous portions 52. At least one discontinuous portion 52 serves as an inlet for the reinforcing member 153. At least one additional discontinuous portion 52 may provide an exit for air bubbles while the reinforcing member 153 is introduced into a gap between the frit 151 and the adhesive 152. This configuration allows the reinforcing member 153 to be uniformly distributed between the frit 151 and the adhesive 152. In one embodiment, the adhesive 152 may include at least one resin selected from the group consisting of epoxy, acrylate, urethane acrylate, and acrylate cyanide. Further, the adhesive 152 is formed along a sealing line (not shown), and includes at least two discontinuous portions 52, causing the adhesive 152 to become discontinuous. Ultra-violet ray or thermal process may be used to cure the adhesive 152.

The reinforcing member 153 functions to relieve impact applied to the frit 151 during a process of scribing the mother substrate (not shown) into unit substrates after the laser has been irradiated to the frit 151. The reinforcing member 153 is disposed between the frit 151 and the adhesive 152, and is injected between the frit 151 and the adhesive 152 through one of the discontinuous portions 52 of the adhesive 152. Here, the reinforcing member 153 may prevent the first and second substrates 100 and 200 adhered by the frit 151 from being damaged due to heat of the laser irradiated to the frit during a scribing process of the substrate. A material having a viscosity less than that of the adhesive 152 may be used to form the reinforcing member 153. In one embodiment, the reinforcing member 153 may include at least one material selected from the group consisting of epoxy, acryl, and urethane. When the reinforcing member 153 has a viscosity equal to or greater than that of the adhesive 152, the reinforcing member 153 may not spread well, thereby preventing uniform injection of the reinforcing member 153 through the discontinuous portion 52. In one embodiment, the viscosity of the reinforcing member 153 ranges from about 100 cp to about 4,000 cp.

The second substrate 200 is bonded to one region of the first substrate 100. The second substrate 200 may function to protect an organic light emitting diode (not shown) formed in the pixel region 100a of the first substrate 100 from external water or oxygen. In one embodiment, the second substrate 200 may include at least one selected from the group consisting of a silicon oxide $SiO_2$, a silicon nitride $SiNx$, and a silicon oxy-nitride $SiOxNy$. In other embodiments, any suitable material may be used for the second substrate 200.

FIG. 2 is a plan view showing an example of a sealing substrate in the organic light emitting display shown in FIG. 1. Referring to FIG. 2, the organic light emitting display includes a first substrate 100, a frit 151, an adhesive 152, a reinforcing member 153, and a second substrate 200.

The first substrate 100 includes a deposition substrate 101 and at least one organic light emitting diode 110. The at least one organic light emitting diode 110 is formed on the deposition substrate 101. First, a buffer layer 111 may be formed on the deposition layer 101. The deposition substrate 101 may be formed of a glass. The buffer layer 111 may be formed of an insulating material such as silicon oxide $SiO_2$ or silicon nitride $SiNx$. The buffer layer 111 prevents the deposition substrate 101 from being damaged due to external heat and the like.

A semiconductor layer 112 may be formed over at least one region of the buffer layer 111. The semiconductor layer 112 includes an active layer 112a and a source/drain region 112b. A gate insulation layer 113 is formed over the buffer layer 111, covering the semiconductor layer 112. A gate electrode 114 is formed over one region of the gate insulation layer 113. The gate electrode 114 has a size corresponding to a width of the active layer 112a.

An interlayer insulation 115 is formed over the gate insulation layer 113, covering have the gate electrode 114. Source and drain electrodes 116a and 116b are formed over predetermined regions of the interlayer insulation 115. The source and drain electrodes 116a and 116b are coupled to one exposed region of the source/drain region 112b. A planarization layer 117 is formed on the interlayer insulation 115, covering the source and drain electrodes 116a and 116b.

A first electrode 119 is formed on one region of the planarization layer 117. The first electrode 119 is coupled with one exposed region of the source and drain electrodes 116a and 116b through a via hole 118.

A pixel definition film 120 is formed on the planarization layer 117, covering the first electrode 119. The pixel definition film 120 includes an opening (not shown) which exposes at least one region of the first electrode 119.

An organic layer 121 is formed in the opening of the pixel definition film 120. A second electrode layer 122 is formed on the pixel definition film 120, covering the organic layer 121.

The frit 151 is disposed between the non-pixel region 100b of the first substrate 100 and the second substrate 200, and bonds the first substrate 100 and the second substrate 200 to each other. In one embodiment, the frit 151 may be formed to seal the pixel region 100a and the scan driver 400 formed on the first substrate 100. In another embodiment, the frit 151 may be formed to seal only the pixel region 100a. The illustrated frit 151 is formed on the pixel definition film 120. A skilled artisan will appreciate that the configuration of the frit may be varied depending on the design of a device.

The adhesive 152 is formed to be spaced from the frit 151, and includes at least two discontinuous portions 52. The adhesive 152 extends along a sealing line (not shown), and includes at least two discontinuous portions 52 in at least two regions, causing the adhesive 152 to be discontinuous.

The reinforcing member 153 functions to relieve external impact onto the frit 151 during a process of scribing the mother substrate (not shown) into unit substrates after the laser has been irradiated to the frit 151. The reinforcing member 153 is disposed between the frit 151 and the adhesive 152, and is injected between the frit 151 and the adhesive 152 through the discontinuous portion 52 of the adhesive 152. The reinforcing member 153 prevents the first and second substrates 100 and 200 from being damaged by heat generated by the laser irradiated to the frit during the scribing process of the substrate.

Since the frit 151, the adhesive 152, and the reinforcing member 153 have been described above with reference to FIG. 1, a more detailed description thereof is omitted.

In order to protect the aforementioned structures formed on the first substrate 100 from external oxygen and moisture, the second substrate 200 is bonded to the first substrate 100, using the frit 151. In one embodiment, the second substrate 200 may include at least one material selected from the group consisting of silicon oxide $SiO_2$, silicon nitride $SiNx$, and silicon oxynitride $SiOxNy$.

Figure 4:
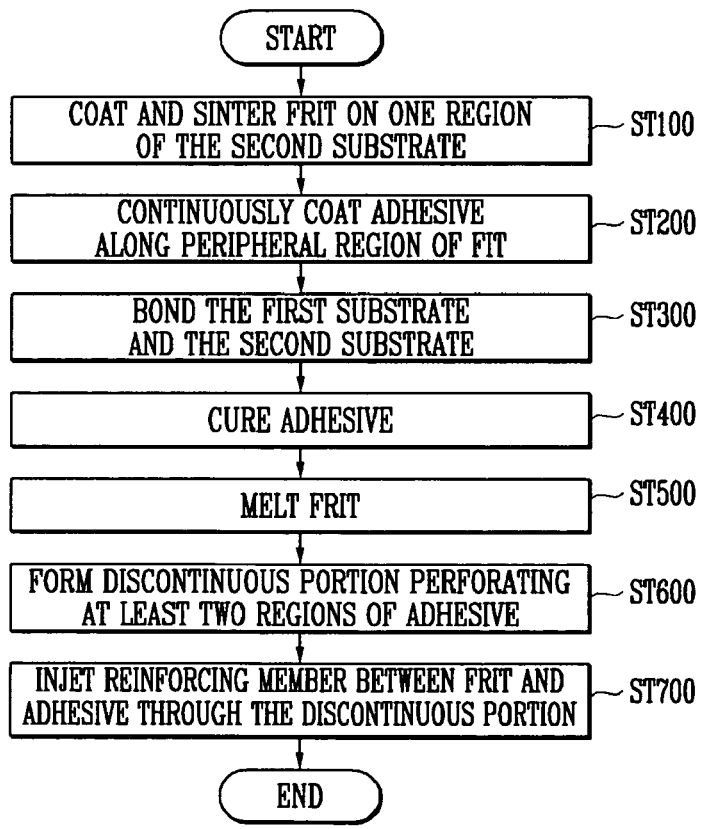
FIG. 4 is a flow chart illustrating a method for fabricating an organic light emitting display according to a first embodiment.

FIG. 4 is a flow chart that illustrates a method for fabricating an organic light emitting display according to a first embodiment. With reference to FIG. 4, a method for fabricating an organic light emitting display according to one embodiment includes a first step ST100 through a seventh step ST700.

The first step ST100 is a step of forming and heating a frit on one region of the second substrate. The frit is interposed between the second substrate and the non-pixel region of the first substrate. In one embodiment, the frit may be formed to seal the pixel region and the scan drive formed on the first substrate. In another embodiment, the frit may be formed to seal the pixel region only. In certain embodiments, the frit includes a filler and an absorbent. The filler adjusts a coefficient of thermal expansion. The absorbent absorbs a laser or an infrared ray.

When a temperature of a glass material is rapidly dropped, a frit in a glass power form is produced. The frit may include a glass powder and an oxide powder. Further, when organic materials are added to the frit, a frit paste in a gel state is formed. The paste in the gel state is applied along a sealing line of the second substrate. Thereafter, when the frit is sintered at a predetermined temperature, the organic materials are removed, leaving a cured a frit in a solid state. In one embodiment, the sintering temperature may range from about 300° C. to about 700° C.

The second step ST200 is a step of applying an adhesive along the frit. In one embodiment, the adhesive includes at least one resin selected from the group consisting of epoxy, acrylate, urethane acrylate, and acrylate cyanide. Applying the adhesive may be performed using a screen printing or dispensing method. In the screen printing method, a desired design pattern is provided on a screen, and areas of the screen are blocked off with a non-permeable material. The adhesive is squeezed through openings of the screen, using a squeegee. In the dispensing method, the adhesive is applied to the second substrate in a predetermined shape and amount, using a machine having a nozzle.

The third step ST300 is a step of bonding the first substrate and the second substrate to each other. The first substrate includes at least one organic light emitting diode, a first electrode, an organic layer, and a second electrode. The first and second substrates are bonded to each other so that the organic light emitting diode is interposed between the first and the second substrates.

The fourth step ST400 is a step of curing an adhesive. The adhesive may be cured by a ultra-violet ray or thermal treatment process.

The fifth step ST500 is a step of melting the frit. The frit absorbs a laser or infrared ray. The laser or infrared ray irradiation melts the frit. In one embodiment, an intensity of the laser for melting the frit ranges from about 25 W to about 50 W. The frit is then cured so that the first and second substrates are bonded to each other.

The sixth step ST600 is a step of forming discontinuous portions in at least two regions of the adhesive. After curing the adhesive and the frit, at least two regions of the adhesive are perforated. Accordingly, at least two openings are formed in the adhesive continuously formed along the frit. At least one discontinuous portion serves as an inlet for the reinforcing member. At least one additional discontinuous portion may provide an exit for air bubbles while the reinforcing member is introduced into a gap between the frit and the adhesive. This configuration allows the reinforcing member to be uniformly distributed between the frit and the adhesive.

The seventh step ST700 is a step of injecting the reinforcing member between the frit and the adhesive through one of the discontinuous portions. Since the frit and the adhesive are spaced apart from each other by a predetermined distance, an empty space exists between the frit and the adhesive. The empty space may prevent the first and second substrates from being bonded to each other completely. Consequently, the first and second substrates are susceptible to impact. During a process of scribing a mother substrate into unit substrates, damages such as crack can easily occur in the device. Accordingly, the reinforcing member is formed to fill the empty space between the frit and the adhesive, and this can absorb impact during the process. In one embodiment, the reinforcing member may include a material having a viscosity less than that of the adhesive. The reinforcing member may include at least one material selected from the group consisting of epoxy, acryl, and urethane. In one embodiment, a viscosity of the reinforcing member may range from about 100 cp to about 4000 cp. The injection process of the reinforcing member may be carried out using a capillary phenomenon or a pressure difference. Then, the reinforcing member may be cured. The reinforcing member can be cured by ultra-violet ray or thermal or rapid curing.

FIG. 5A to FIG. 5F are views that illustrate a method for fabrication an organic light emitting display according to a second embodiment. Referring to FIG. 5A to FIG. 5F, the organic light emitting display includes a first mother substrate 1000 and a second mother substrate 2000. The first mother substrate 1000 includes at least one pixel region 100a and at least one non-pixel region 100b. An organic light emitting diode is formed in the pixel region 100a. The non-pixel region 100b is formed outside the pixel region 100a. The second mother substrate 2000 is bonded to the first mother substrate 1000.

In fabricating an organic light emitting display, the frit 151 is formed and sintered in regions of the second mother substrate 2000 which correspond to the non-pixel regions 100b of the first mother substrate 1000. The frit 151 is interposed between the second mother substrate 2000 and the non-pixel region 100b of the first mother substrate 1000. The frit 151 may include a filler (not shown) and an absorbent (not shown). The filler may adjust a coefficient of thermal expansion. The absorbent absorbs a laser or an infrared ray.

Figure 5A:
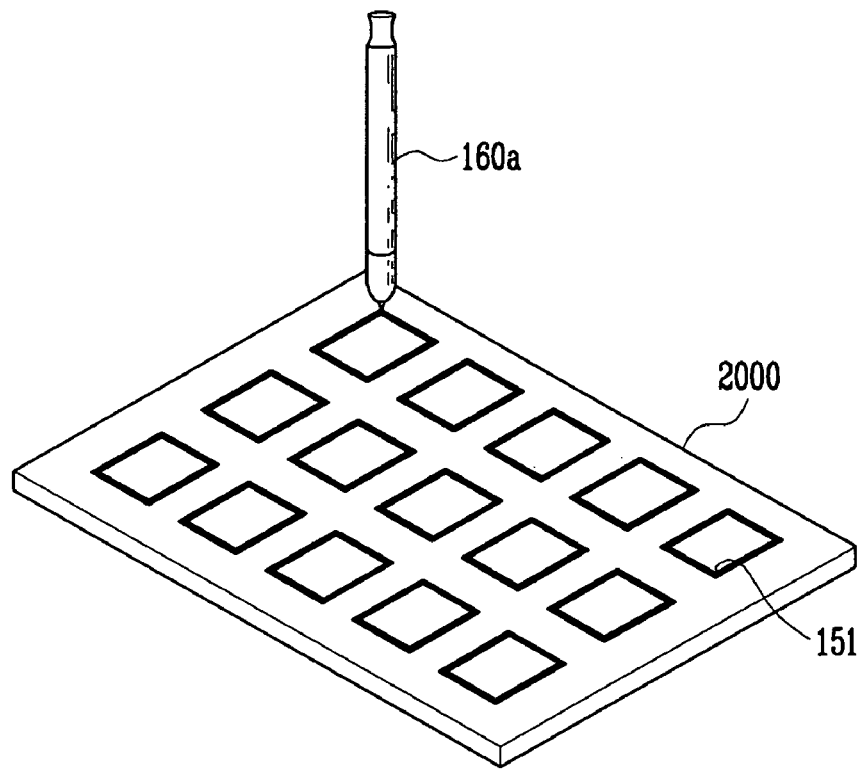
FIG. 5A to FIG. 5F are schematic views illustrating a method for fabricating an organic light emitting display according to a second embodiment.

When a temperature of a glass material is rapidly dropped, a frit in a glass power form is produced. The frit may include a glass powder and an oxide powder. Further, when organic materials are added to the frit 151, a paste in a gel state is formed. The paste in the gel state is applied along a sealing line of the second mother substrate 2000 using a first injector 160a. Thereafter, when the frit 151 is sintered at a predetermined temperature, organic materials are removed, leaving a cured frit in a solid state. In one embodiment, the sintering temperature may range from about 300° C. to about 700° C. (FIG. 5A).

Next, the adhesive 152 is applied using a second injector 160b to be spaced from the outside of the frit 151. The adhesive 152 includes at least one discontinuous portion 52. The discontinuous portion 52 refers to a cut-off region of the adhesive 152 by a predetermined interval. At least one discontinuous portion 52 may function as an inlet for the reinforcing member 153. At least one additional discontinuous portion 52 may provide an exit for air bubbles while the reinforcing member 153 may be introduced into a gap between the frit 151 and the adhesive 152. When the at least two discontinuous portions 52 are formed, the reinforcing member 153 may be filled in a space between the frit 151 and the adhesive 152. In one embodiment, the adhesive 152 includes at least one resin selected from the group consisting of epoxy, acrylate, urethane acrylate, and acrylate cyanide.

Figure 5B:
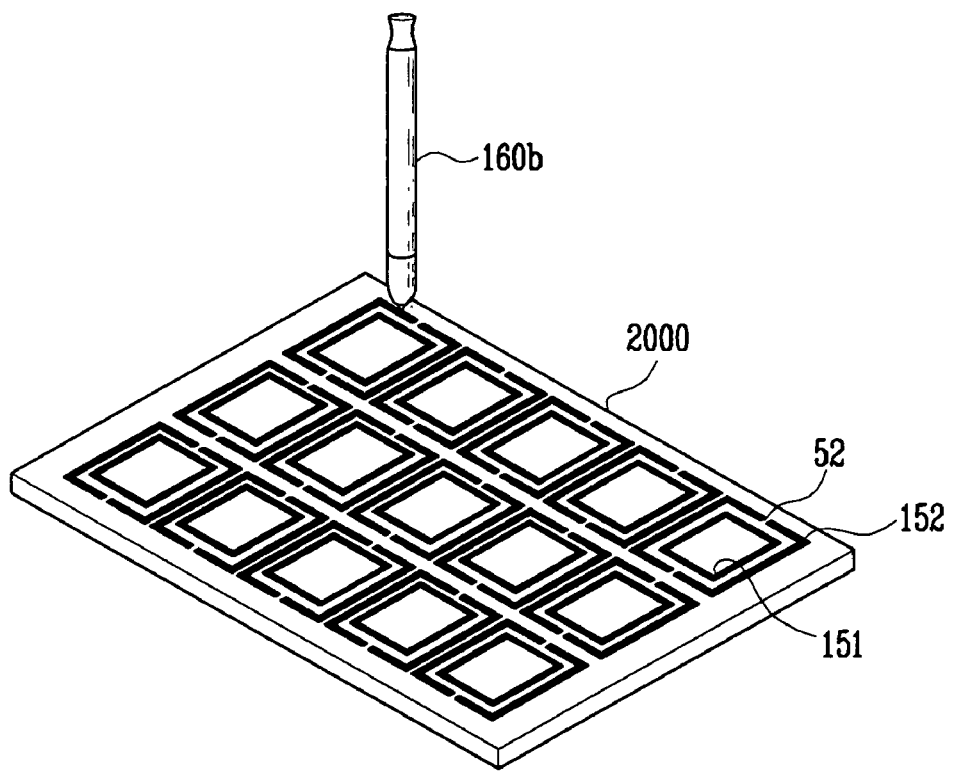

Further, the adhesive may be applied using a screen printing or dispensing method. In the screen printing method, a desired design pattern is provided on a screen, and areas of the screen are blocked off with a non-permeable material. The adhesive is squeezed through openings of the screen, using a squeegee. In the dispensing method, the adhesive is applied to the second substrate in a predetermined shape and amount, using a machine having a nozzle (FIG. 5B).

Figure 5C:
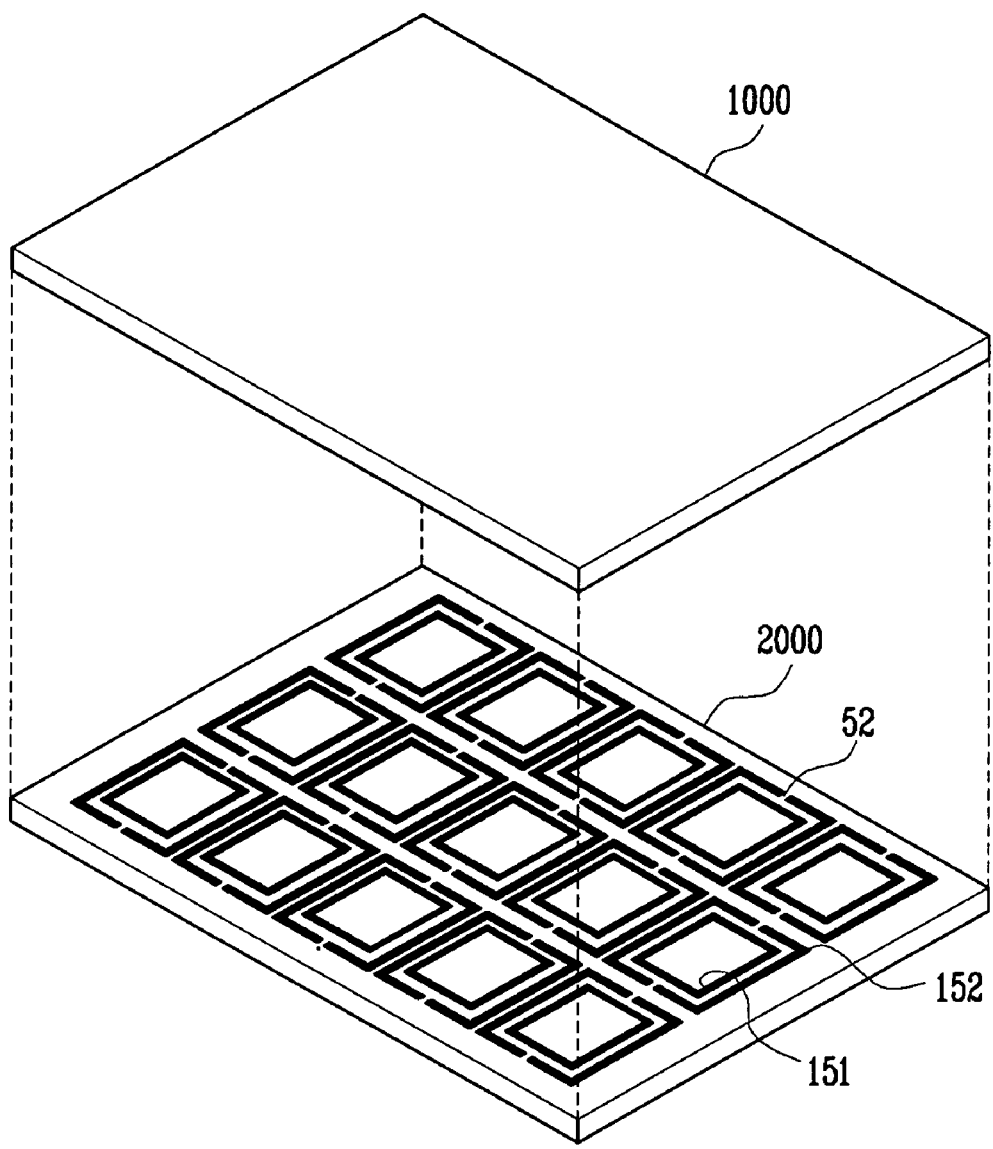
Figure 5D:
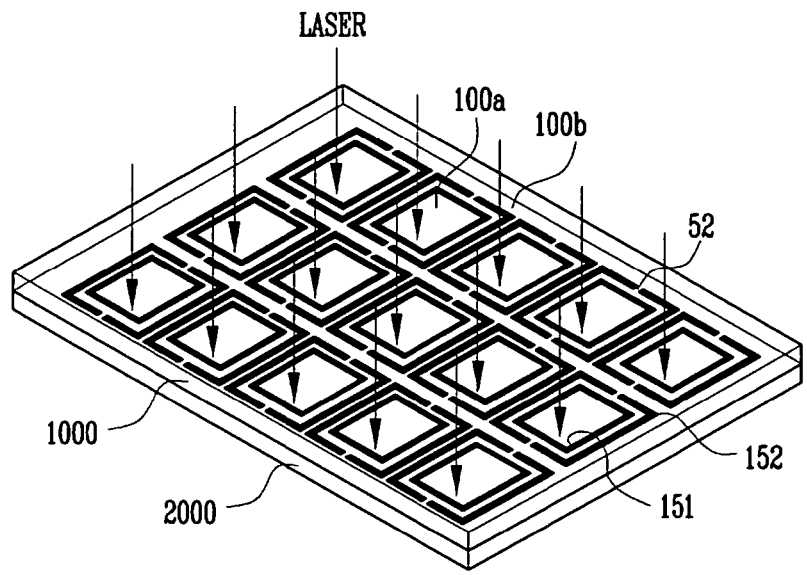

Next, the first mother substrate 1000 and the second mother substrate 2000 are bonded to each other. At least organic light emitting diode (not shown) has been already formed on the first mother substrate 1000. The organic light emitting diode may include a first electrode, an organic layer, and a second electrode. The first mother substrate 1000 and the second mother substrate 2000 are aligned with each other such that the organic light emitting diode is interposed between the first mother substrate 1000 and the second mother substrate 2000 (FIG. 5C).

Then, the adhesive 152 is cured. The adhesive 152 can be cured using ultra-violet ray or thermal treatment.

Next, a laser or infrared ray is irradiated to the frit 151 to be melted and cured. The frit 151 may include a filler (not shown) and an absorbent (not shown) therein. The filler may adjust a coefficient of thermal expansion. The absorbent may absorb a laser or an infrared ray. An intensity of the laser for melting the frit 151 may range about 25 to about 60 W. The frit 151 is cured to bond the second mother substrate 2000 to the first mother substrate 1000.

Thereafter, the bonded first and second mother substrates 1000 and 2000 are scribed into a plurality of display panels 10. The adhesive 152 can prevent a stress occurring during the scribing process from being transferred to a scribing surface. This reduces a defective rate of the scribing process.

Figure 5E:
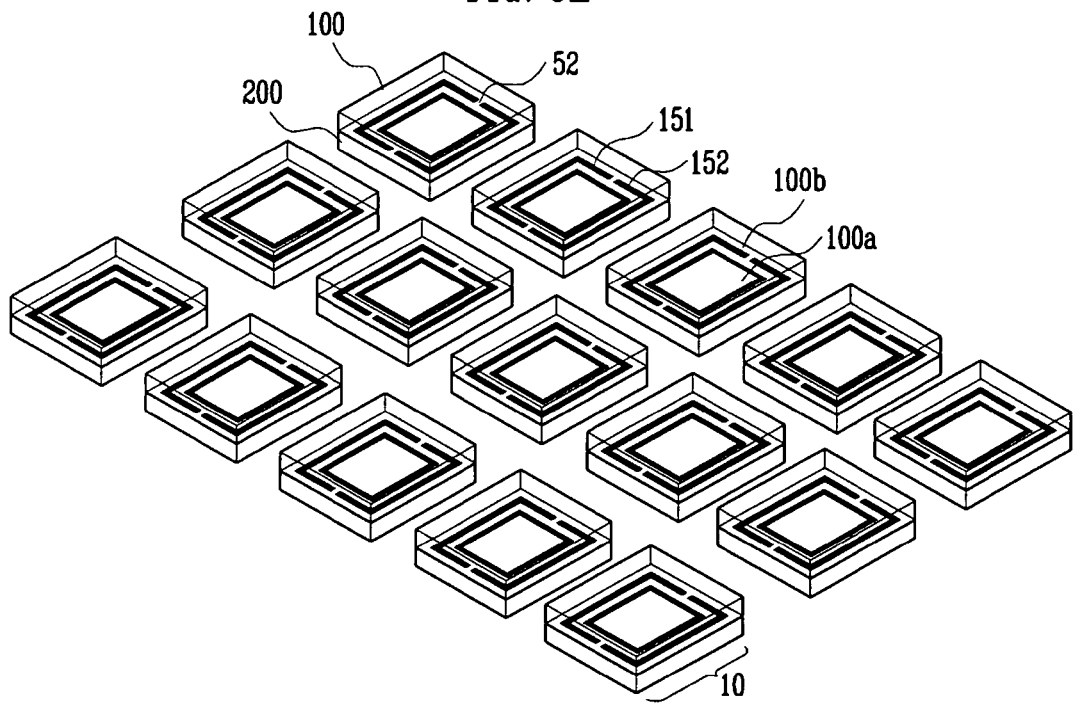
Figure 5F:
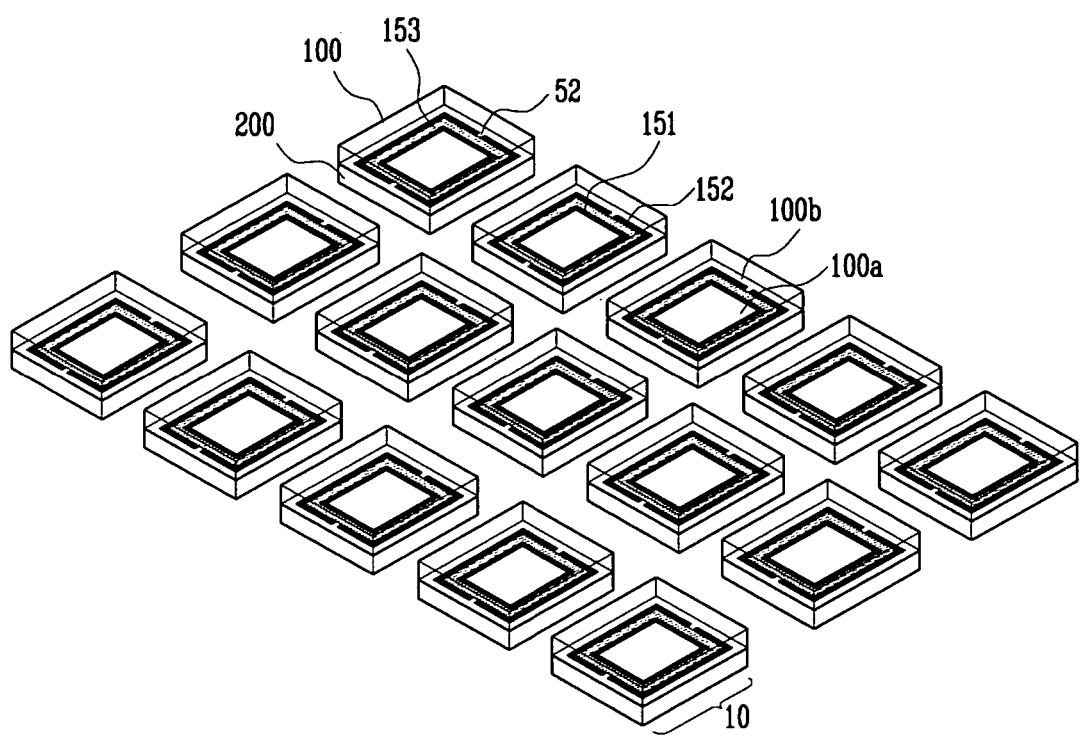

Next, the reinforcing member 153 is injected between the frit 151 and the adhesive 152 through the discontinuous portion 52 of the adhesive 152. Because the frit 151 and the adhesive 152 are spaced from each other by a predetermined distance, an empty space is formed between the frit 151 and the adhesive 152. The empty space prevents the first mother substrate 1000 and the second mother substrate 2000 from being bonded to each other perfectly. Thus, they are susceptible to external impact. During the process of scribing a substrate into unit substrates, damages such as crack occur easily. Accordingly, the reinforcing member 153 fills the empty space between the frit 151 and the adhesive 152, and absorbs impact during the process. In one embodiment, the reinforcing member 153 may include a material having a viscosity less than that of the adhesive 152. The reinforcing member 153 may include at least one material selected from the group consisting of epoxy, acryl, and urethane. In one embodiment, a viscosity of the reinforcing member 153 ranges from about 100 cp to about 4000 cp. Also, an injection process of the reinforcing member 153 may be carried out using a capillary phenomenon or a pressure difference, and then the reinforcing member 153 is cured (FIG. 5E). The reinforcing member 153 can be cured by ultra-violet ray or thermal or rapid curing.

According to the organic light emitting display and a method for fabricating the same, impact resistance and stress resistance of a device are enhanced using an reinforcing member in addition to a sealant. Accordingly, during a process of scribing a mother substrate into a plurality of unit substrates, a defective rate of a device can be reduced.

Although a few embodiments have been shown and described, it would be appreciated by those skilled in the art that changes might be made in this embodiment without departing from the principles and spirit of the invention, the scope of which is defined in the claims and their equivalents.

What is claimed is:

1. An organic light emitting display (OLED) device, comprising:
    a first substrate;
    a second substrate placed over the first substrate, wherein each of the first and second substrates is made of a single layer or comprises a plurality of layers;
    an array of organic light-emitting pixels interposed between the first and second substrates; and
    a sealing structure interposed between the first and second substrates while surrounding the array, wherein the sealing structure, the first substrate and the second substrate in combination define an enclosed space in which the array is located;
    wherein the sealing structure comprises a first member, a second member and a third member, the first member comprising a first material, the second member comprising a second material, and the third member comprising a third material,
    wherein the first member forms a closed loop surrounding the array,
    wherein the third member substantially surrounds the first member while having at least one discontinuous portion, and
    wherein the second member is formed by injecting a precursor of the second material through the discontinuous portion, and by subsequently curing the precursor to form the second material between the first and third members.

2. The device of claim 1, wherein the second member forms a closed loop surrounding the first member.

3. The device of claim 1, wherein the third member comprises at least two discontinuous portions.

4. The device of claim 1, wherein the at least one discontinuous portion comprises a gap or a material other than the third material.

5. The device of claim 1, wherein the first material comprises frit.

6. The device of claim 1, wherein the second material is the same as the third material.

7. The device of claim 6, wherein there is an identifiable interface between the second and third members.

8. The device of claim 1, wherein the second material is different from the third material.

9. The device of claim 1, wherein the second material comprises one or more selected from the group consisting of epoxy, acryl, and urethane resin.

10. The device of claim 1, wherein the third material comprises one or more selected from the group consisting of epoxy, acrylate, urethane acrylate, and acrylate cyanide resin.

11. The device of claim 1, wherein the first member comprises one or more materials selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate.

12. A method of making an organic light emitting display (OLED) device, the method comprising:
    providing an intermediate device comprising:
        a first substrate;
        a second substrate placed over the first substrate;
        an array of organic light-emitting pixels interposed between the first and second substrates; and
        a first sealing member interposed between the first and second substrates while substantially surrounding the array, a third sealing member having at least one discontinuous portion and interposed between the first and second substrates while substantially surrounding the first sealing member with a space defined between the first and third sealing members and further between the first and second substrates; and subsequently filling a material into the space defined between the first and third sealing members of the intermediate device through the discontinuous portion so as to form a second sealing member interposed between the first and second substrates and further between the first and third sealing members.

13. The method of claim 12, wherein the third sealing member comprises at least one discontinuous portion while substantially surrounding the first sealing member.

14. The method of claim 13, wherein filling comprises injecting the material into the space via the at least one discontinuous portion.

15. The method of claim 14, wherein filling further comprises moving the material within the space.

16. The method of claim 15, wherein moving the material within the space uses positive or negative air pressure.

17. The method of claim 12, wherein the third sealing member comprises a portion generally parallel to a portion of the first sealing member.

18. The method of claim 12, further comprising curing the material after filling into the space.

19. The method of claim 12, wherein the first sealing member comprises fit and forms a closed loop surrounding the array.

20. The method of claim 12, wherein the second sealing member and third sealing member comprises substantially the same material.

21. The method of claim 12, wherein providing the device comprises:

providing the second substrate, the first sealing member formed on the second substrate and the third sealing member formed on the second substrate; and arranging the first and second substrates such that the array is interposed between the first and second substrates and that the array is surrounded by the first sealing member.

22. The method of claim 12, wherein providing the device comprises:

providing the first substrate and the first sealing member formed on the first substrate; and forming the third sealing member substantially parallel to the first sealing member with a gap therebetween; and arranging the first and second substrates such that the array is interposed between the first and second substrates and that the array is surrounded by the first sealing member.

23. The method of claim 22, wherein providing the device further comprises melting and re-solidifying at least part of the first sealing member after arranging so as to bond the first sealing member to the first and second substrates.

24. The method of claim 22, wherein forming the third sealing material comprises utilizing a screen printing or dispensing method.

25. The method of claim 12, wherein the device further comprises:

a plurality of additional arrays of organic light-emitting pixels interposed between the first and second substrates;

a plurality of additional first sealing members interposed between the first and second substrates, a first one of the additional first sealing members surrounding one of the additional arrays;

a plurality of additional third sealing members interposed between the first and second substrates, one of the additional third sealing members substantially surrounds the first one of the additional first sealing members with an additional space, which is defined between the first one of the additional first sealing members and the one of the additional third sealing members, and wherein the additional space is further between the first and second substrates; and wherein the method further comprises filling the material into the additional space so as to form an additional second sealing member interposed between the first one of the additional first sealing members and the one of the additional third sealing members.

26. The method of claim 25, further comprising cutting the resulting product into a plurality of pieces, comprising a cut-portion of the first substrate, a cut-portion of the second substrate, the array of organic light-emitting pixels, the first sealing member, the second sealing member and the third sealing member.

* * * * *